United States Patent
Pawlowski et al.

(10) Patent No.: US 8,601,341 B2
(45) Date of Patent: Dec. 3, 2013

(54) MEMORY SYSTEM AND METHOD USING ECC WITH FLAG BIT TO IDENTIFY MODIFIED DATA

(71) Applicant: Micron Technology, Inc., Boise, ID (US)

(72) Inventors: J. Thomas Pawlowski, Boise, ID (US); John F. Schreck, Lucas, TX (US)

(73) Assignee: Micron Technologies, Inc., Boise, ID (US)

( * ) Notice: Subject to any disclaimer, the term of this patent is extended or adjusted under 35 U.S.C. 154(b) by 0 days.

(21) Appl. No.: 13/855,534

(22) Filed: Apr. 2, 2013

(65) Prior Publication Data

US 2013/0254626 A1    Sep. 26, 2013

Related U.S. Application Data (60) Continuation of application No. 13/026,833, filed on Feb. 14, 2011, now Pat. No. 8,413,007, which is a division of application No. 11/583,198, filed on Oct. 18, 2006, now Pat. No. 7,900,120.

(51) Int. Cl.
  *H03M 13/00* (2006.01)

(52) U.S. Cl.
  USPC .......................................................... 714/754

(58) Field of Classification Search
  USPC .......... 714/6.1, 6.13, 746, 754, 763, 767, 773
  See application file for complete search history.

(56) References Cited

U.S. PATENT DOCUMENTS

| | | | |
|---|---|---|---|
| 4,006,468 A | 2/1977 | Webster | |
| 4,334,295 A | 6/1982 | Nagami | |
| 4,380,812 A | 4/1983 | Ziegler, II et al. | |
| 4,433,211 A | 2/1984 | McCalmont et al. | |
| 4,493,081 A | 1/1985 | Schmidt | |
| 4,598,402 A | 7/1986 | Matsumoto et al. | |
| 4,617,660 A | 10/1986 | Sakamoto | |
| 4,694,454 A | 9/1987 | Matsuura | |
| 4,706,249 A | 11/1987 | Nakagawa et al. | |
| 4,710,934 A | 12/1987 | Traynor | |
| 4,766,573 A | 8/1988 | Takemae | |
| 4,780,875 A | 10/1988 | Sakai | |
| 4,858,236 A | 8/1989 | Ogasawara | |

(Continued)

OTHER PUBLICATIONS

International Search Report and Written Opinion in International Application No. PCT/2005/24322 mailed Dec. 15, 2006.

(Continued)

*Primary Examiner* — Shelly A Chase
(74) *Attorney, Agent, or Firm* — Dorsey & Whitney LLP (57) ABSTRACT

A DRAM device includes an ECC generator/checker that generates ECC syndromes corresponding to items of data stored in the DRAM device. The DRAM device also includes an ECC controller that causes the ECC syndromes to be stored in the DRAM device. The ECC controller also causes a flag bit having a first value to be stored in the DRAM device when a corresponding ECC syndrome is stored. The ECC controller changes the flag bit to a second value whenever the corresponding data bits are modified, this indicating that the stored syndrome no longer corresponds to the stored data. In such case, the ECC controller causes a new ECC syndrome to be generated and stored, and the corresponding flag bit is reset to the first value. The flag bits may be checked in this manner during a reduced power refresh to ensure that the stored syndromes correspond to the stored data.

21 Claims, 6 Drawing Sheets

(56) References Cited

U.S. PATENT DOCUMENTS

| | | |
|---|---|---|
| 4,862,463 A | 8/1989 | Chen |
| 4,888,773 A | 12/1989 | Arlington et al. |
| 4,918,692 A | 4/1990 | Hidaka et al. |
| 4,937,830 A | 6/1990 | Kawashima et al. |
| 4,958,325 A | 9/1990 | Nakagome et al. |
| 5,012,472 A | 4/1991 | Arimoto et al. |
| 5,033,026 A | 7/1991 | Tsujimoto |
| 5,056,089 A | 10/1991 | Furuta et al. |
| 5,127,014 A | 6/1992 | Raynham |
| 5,172,339 A | 12/1992 | Noguchi et al. |
| 5,208,782 A | 5/1993 | Sakuta et al. |
| 5,278,796 A | 1/1994 | Tillinghast et al. |
| 5,291,498 A | 3/1994 | Jackson et al. |
| 5,307,356 A | 4/1994 | Fifield |
| 5,313,425 A | 5/1994 | Lee et al. |
| 5,313,464 A | 5/1994 | Reiff |
| 5,313,475 A | 5/1994 | Cromer et al. |
| 5,313,624 A | 5/1994 | Harriman et al. |
| 5,321,661 A | 6/1994 | Iwakiri et al. |
| 5,331,601 A | 7/1994 | Parris |
| 5,335,201 A | 8/1994 | Walther et al. |
| 5,369,651 A | 11/1994 | Marisetty |
| 5,418,796 A | 5/1995 | Price et al. |
| 5,428,630 A | 6/1995 | Weng et al. |
| 5,432,802 A | 7/1995 | Tsuboi |
| 5,446,695 A | 8/1995 | Douse et al. |
| 5,448,578 A | 9/1995 | Kim |
| 5,450,424 A | 9/1995 | Okugaki et al. |
| 5,455,801 A | 10/1995 | Blodgett et al. |
| 5,459,742 A | 10/1995 | Cassidy et al. |
| 5,481,552 A | 1/1996 | Aldereguia et al. |
| 5,509,132 A | 4/1996 | Matsuda et al. |
| 5,513,135 A | 4/1996 | Dell et al. |
| 5,515,333 A | 5/1996 | Fujita et al. |
| 5,588,112 A | 12/1996 | Dearth et al. |
| 5,596,521 A | 1/1997 | Tanaka et al. |
| 5,600,662 A | 2/1997 | Zook |
| 5,604,703 A | 2/1997 | Nagashima |
| 5,623,506 A | 4/1997 | Dell et al. |
| 5,629,898 A | 5/1997 | Idei et al. |
| 5,631,914 A | 5/1997 | Kashida et al. |
| 5,644,545 A | 7/1997 | Fisch |
| 5,703,823 A | 12/1997 | Douse et al. |
| 5,706,225 A | 1/1998 | Buchenrieder et al. |
| 5,712,861 A | 1/1998 | Inoue et al. |
| 5,732,092 A | 3/1998 | Shinohara |
| 5,740,188 A | 4/1998 | Olarig |
| 5,742,554 A | 4/1998 | Fujioka |
| 5,754,753 A | 5/1998 | Smelser |
| 5,761,222 A | 6/1998 | Baldi |
| 5,765,185 A | 6/1998 | Lambrache et al. |
| 5,784,328 A | 7/1998 | Irrinki et al. |
| 5,784,391 A | 7/1998 | Konigsburg |
| 5,808,952 A | 9/1998 | Fung et al. |
| 5,841,418 A | 11/1998 | Bril et al. |
| 5,864,569 A | 1/1999 | Roohparvar |
| 5,878,059 A | 3/1999 | Maclellan |
| 5,896,404 A | 4/1999 | Kellogg et al. |
| 5,909,404 A | 6/1999 | Schwarz |
| 5,912,906 A | 6/1999 | Wu et al. |
| 5,953,278 A | 9/1999 | McAdams et al. |
| 5,961,660 A | 10/1999 | Capps, Jr. et al. |
| 5,963,103 A | 10/1999 | Blodgett |
| 6,009,547 A | 12/1999 | Jaquette et al. |
| 6,009,548 A | 12/1999 | Chen et al. |
| 6,018,817 A | 1/2000 | Chen et al. |
| 6,041,001 A | 3/2000 | Estakhri |
| 6,041,430 A | 3/2000 | Yamauchi |
| 6,052,815 A | 4/2000 | Zook |
| 6,052,818 A * | 4/2000 | Dell et al. ................ 714/773 |
| 6,078,543 A | 6/2000 | Kim |
| 6,085,283 A | 7/2000 | Toda |
| 6,085,334 A | 7/2000 | Giles et al. |
| 6,092,231 A | 7/2000 | Sze |
| 6,101,614 A | 8/2000 | Gonzales et al. |
| 6,125,467 A | 9/2000 | Dixon |
| 6,134,167 A | 10/2000 | Atkinson |
| 6,137,739 A | 10/2000 | Kim |
| 6,166,908 A | 12/2000 | Samaras |
| 6,178,537 B1 | 1/2001 | Roohparvar |
| 6,199,139 B1 | 3/2001 | Katayama et al. |
| 6,212,118 B1 | 4/2001 | Fujita |
| 6,212,631 B1 | 4/2001 | Springer et al. |
| 6,216,246 B1 | 4/2001 | Shau |
| 6,216,247 B1 | 4/2001 | Creta et al. |
| 6,219,807 B1 | 4/2001 | Ebihara et al. |
| 6,223,309 B1 | 4/2001 | Dixon et al. |
| 6,233,717 B1 | 5/2001 | Choi |
| 6,262,925 B1 | 7/2001 | Yamasaki |
| 6,279,072 B1 | 8/2001 | Williams et al. |
| 6,310,825 B1 | 10/2001 | Furuyama |
| 6,324,119 B1 | 11/2001 | Kim |
| 6,349,068 B2 | 2/2002 | Takemae et al. |
| 6,349,390 B1 | 2/2002 | Dell et al. |
| 6,353,910 B1 | 3/2002 | Carnevale et al. |
| 6,397,290 B1 | 5/2002 | Williams et al. |
| 6,397,357 B1 | 5/2002 | Cooper |
| 6,397,365 B1 | 5/2002 | Brewer et al. |
| 6,404,687 B2 | 6/2002 | Yamasaki |
| 6,426,908 B1 | 7/2002 | Hidaka |
| 6,438,066 B1 | 8/2002 | Ooishi et al. |
| 6,442,644 B1 | 8/2002 | Gustavson et al. |
| 6,457,153 B2 | 9/2002 | Yamamoto et al. |
| 6,484,246 B2 | 11/2002 | Tsuchida et al. |
| 6,487,136 B2 | 11/2002 | Hidaka |
| 6,510,537 B1 | 1/2003 | Lee |
| 6,518,595 B2 | 2/2003 | Lee |
| 6,526,537 B2 | 2/2003 | Kishino |
| 6,545,899 B1 | 4/2003 | Derner et al. |
| 6,549,460 B2 | 4/2003 | Nozoe et al. |
| 6,556,497 B2 | 4/2003 | Cowles et al. |
| 6,557,072 B2 | 4/2003 | Osborn |
| 6,560,155 B1 | 5/2003 | Hush |
| 6,570,803 B2 | 5/2003 | Kyung |
| 6,584,543 B2 | 6/2003 | Williams et al. |
| 6,591,394 B2 | 7/2003 | Lee et al. |
| 6,594,796 B1 | 7/2003 | Chiang |
| 6,601,211 B1 | 7/2003 | Norman |
| 6,603,694 B1 | 8/2003 | Frankowsky et al. |
| 6,603,696 B2 | 8/2003 | Janzen |
| 6,603,697 B2 | 8/2003 | Janzen |
| 6,603,698 B2 | 8/2003 | Janzen |
| 6,609,236 B2 | 8/2003 | Watanabe et al. |
| 6,614,698 B2 | 9/2003 | Ryan et al. |
| 6,618,281 B1 | 9/2003 | Gordon |
| 6,618,314 B1 | 9/2003 | Fiscus et al. |
| 6,618,319 B2 | 9/2003 | Ooishi et al. |
| 6,628,558 B2 | 9/2003 | Fiscus |
| 6,633,509 B2 | 10/2003 | Scheuerlein et al. |
| 6,636,444 B2 | 10/2003 | Uchida et al. |
| 6,636,446 B2 | 10/2003 | Lee et al. |
| 6,646,942 B2 | 11/2003 | Janzen |
| 6,662,333 B1 | 12/2003 | Zhang et al. |
| 6,665,231 B2 | 12/2003 | Mizuno et al. |
| 6,678,860 B1 | 1/2004 | Lee |
| 6,681,332 B1 | 1/2004 | Byrne et al. |
| 6,697,926 B2 | 2/2004 | Johnson et al. |
| 6,697,992 B2 | 2/2004 | Ito et al. |
| 6,701,480 B1 | 3/2004 | Karpuszka et al. |
| 6,704,230 B1 | 3/2004 | DeBrosse et al. |
| 6,715,104 B2 | 3/2004 | Imbert de Tremiolles et al. |
| 6,715,116 B2 | 3/2004 | Lester et al. |
| 6,721,223 B2 | 4/2004 | Matsumoto et al. |
| 6,735,726 B2 | 5/2004 | Muranaka et al. |
| 6,751,143 B2 | 6/2004 | Morgan et al. |
| 6,754,858 B2 | 6/2004 | Borkenhagen et al. |
| 6,775,190 B2 | 8/2004 | Setogawa |
| 6,778,457 B1 | 8/2004 | Burgan |
| 6,781,908 B1 | 8/2004 | Pelley et al. |
| 6,785,837 B1 | 8/2004 | Kilmer et al. |
| 6,788,616 B2 | 9/2004 | Takahashi |
| 6,789,209 B1 | 9/2004 | Suzuki et al. |
| 6,792,567 B2 | 9/2004 | Laurent |
| 6,795,362 B2 | 9/2004 | Nakai et al. |

(56) References Cited

U.S. PATENT DOCUMENTS

| | | |
|---|---|---|
| 6,799,291 B1 | 9/2004 | Kilmer et al. |
| 6,807,108 B2 | 10/2004 | Maruyama et al. |
| 6,810,449 B1 | 10/2004 | Barth et al. |
| 6,819,589 B1 | 11/2004 | Aakjer |
| 6,819,624 B2 | 11/2004 | Acharya et al. |
| 6,834,022 B2 | 12/2004 | Derner et al. |
| 6,920,523 B2 | 7/2005 | Le et al. |
| 6,934,199 B2 | 8/2005 | Johnson et al. |
| 6,940,773 B2 | 9/2005 | Poechmueller |
| 6,940,774 B2 | 9/2005 | Perner |
| 6,944,074 B2 | 9/2005 | Chung et al. |
| 6,954,387 B2 | 10/2005 | Kim et al. |
| 6,965,537 B1 | 11/2005 | Klein et al. |
| 7,002,397 B2 | 2/2006 | Kubo et al. |
| 7,027,337 B2 | 4/2006 | Johnson et al. |
| 7,051,260 B2 | 5/2006 | Ito et al. |
| 7,095,669 B2 | 8/2006 | Oh |
| 7,096,407 B2 | 8/2006 | Olarig |
| 7,099,221 B2 | 8/2006 | Klein |
| 7,116,602 B2 | 10/2006 | Klein |
| 7,117,420 B1 | 10/2006 | Yeung et al. |
| 7,149,141 B2 | 12/2006 | Johnson et al. |
| 7,167,403 B2 | 1/2007 | Riho et al. |
| 7,171,605 B2 | 1/2007 | White |
| 7,184,351 B2 | 2/2007 | Ito et al. |
| 7,184,352 B2 | 2/2007 | Klein et al. |
| 7,190,628 B2 | 3/2007 | Choi et al. |
| 7,216,198 B2 | 5/2007 | Ito et al. |
| 7,225,390 B2 | 5/2007 | Ito et al. |
| 7,231,488 B2 | 6/2007 | Poechmueller |
| 7,249,289 B2 | 7/2007 | Muranaka et al. |
| 7,254,067 B2 | 8/2007 | Johnson et al. |
| 7,269,085 B2 | 9/2007 | Sohn et al. |
| 7,272,066 B2 | 9/2007 | Klein |
| 7,272,773 B2 | 9/2007 | Cargnoni et al. |
| 7,277,345 B2 | 10/2007 | Klein |
| 7,280,386 B2 | 10/2007 | Klein |
| 7,317,648 B2 | 1/2008 | Jo |
| 7,318,183 B2 | 1/2008 | Ito et al. |
| 7,340,668 B2 | 3/2008 | Klein |
| 7,372,749 B2 | 5/2008 | Poechmueller |
| 7,428,687 B2 | 9/2008 | Klein |
| 7,444,577 B2 | 10/2008 | Best et al. |
| 7,447,973 B2 | 11/2008 | Klein |
| 7,447,974 B2 | 11/2008 | Klein |
| 7,453,758 B2 | 11/2008 | Hoffmann |
| 7,461,320 B2 | 12/2008 | Klein |
| 7,478,285 B2 | 1/2009 | Fouquet-Lapar |
| 7,493,531 B2 | 2/2009 | Ito et al. |
| 7,500,171 B2 | 3/2009 | Suzuki |
| 7,526,713 B2 | 4/2009 | Klein |
| 7,539,926 B1 | 5/2009 | Lesea |
| 7,558,142 B2 | 7/2009 | Klein |
| 7,836,374 B2 | 11/2010 | Klein |
| 7,894,289 B2 | 2/2011 | Pawlowski |
| 7,900,120 B2 | 3/2011 | Pawlowski et al. |
| 8,413,007 B2 | 4/2013 | Pawlowski et al. |
| 2001/0029592 A1 | 10/2001 | Walker et al. |
| 2001/0044917 A1 | 11/2001 | Lester et al. |
| 2001/0052090 A1 | 12/2001 | Mio |
| 2001/0052102 A1 | 12/2001 | Roohparvar |
| 2002/0013924 A1 | 1/2002 | Yamasoto |
| 2002/0152444 A1 | 10/2002 | Chen et al. |
| 2002/0162069 A1 | 10/2002 | Laurent |
| 2002/0184592 A1 | 12/2002 | Koga et al. |
| 2003/0009721 A1 | 1/2003 | Hsu et al. |
| 2003/0093744 A1 | 5/2003 | Leung et al. |
| 2003/0097608 A1 | 5/2003 | Rodeheffer et al. |
| 2003/0101405 A1 | 5/2003 | Shibata |
| 2003/0128612 A1 | 7/2003 | Moore et al. |
| 2003/0149855 A1 | 8/2003 | Shibata et al. |
| 2003/0167437 A1 | 9/2003 | DeSota et al. |
| 2003/0191888 A1 | 10/2003 | Klein |
| 2004/0008562 A1 | 1/2004 | Ito et al. |
| 2004/0064646 A1 | 4/2004 | Emerson et al. |
| 2004/0083334 A1 | 4/2004 | Chang et al. |
| 2004/0098654 A1 | 5/2004 | Cheng et al. |
| 2004/0100847 A1 | 5/2004 | Derner et al. |
| 2004/0117723 A1 | 6/2004 | Foss |
| 2004/0205429 A1 | 10/2004 | Yoshida et al. |
| 2004/0225944 A1 | 11/2004 | Brueggen |
| 2005/0099868 A1 | 5/2005 | Oh |
| 2005/0146958 A1 | 7/2005 | Moore et al. |
| 2006/0010339 A1 | 1/2006 | Klein |
| 2007/0268756 A1 | 11/2007 | Johnson et al. |
| 2008/0002503 A1 | 1/2008 | Klein |
| 2008/0092016 A1 | 4/2008 | Pawlowski |
| 2008/0109705 A1 | 5/2008 | Pawlowski et al. |
| 2009/0067267 A1 | 3/2009 | Johnson et al. |
| 2010/0054070 A1 | 3/2010 | Klein |
| 2011/0038217 A1 | 2/2011 | Johnson et al. |
| 2013/0003467 A1 | 1/2013 | Klein |

OTHER PUBLICATIONS

Idei, Youji "Dual-Period Self-Refresh Scheme for Low-Power DRAM's with On-Chip PROM Mode Register", IEEE Journal of Solid State Circuits, vol. 33, No. 2, Feb. 1998, 253-259.

Stojko, J. et al., "Error-Correction Code", IBM Technical Disclosure Bulletin, vol. 10, No. 10, Mar. 1968.

* cited by examiner

MEMORY SYSTEM AND METHOD USING ECC WITH FLAG BIT TO IDENTIFY MODIFIED DATA

CROSS-REFERENCE TO RELATED APPLICATION

This application is a continuation of U.S. patent application Ser. No. 13/026,833, filed Feb. 14, 2011, and issued as U.S. Pat. No. 8,413,007 on Apr. 2, 2013, which is a divisional of U.S. patent application Ser. No. 11/583,198, filed Oct. 18, 2006, and issued as U.S. Pat. No. 7,900,120 on Mar. 1, 2011. These applications and patents are incorporated by reference herein in their entirety for any purpose.

TECHNICAL FIELD

This invention relates to memory devices, and, more particularly, to a method and system for efficiently checking and correcting data read from memory devices to allow the memory devices to consume relatively little power during refresh.

BACKGROUND OF THE INVENTION

As the use of electronic devices, such as personal computers, continues to increase, it is becoming ever more important to make such devices portable. The usefulness of portable electronic devices, such as notebook computers, is limited by the limited length of time batteries are capable of powering the device before needing to be recharged. This problem has been addressed by attempts to increase battery life and attempts to reduce the rate at which such electronic devices consume power.

Various techniques have been used to reduce power consumption in electronic devices, the nature of which often depends upon the type of power consuming electronic circuits that are in the device. For example, electronic devices such as notebook computers, typically include memory devices, such as dynamic random access memory ("DRAM") devices, that consume a substantial amount of power. As the data storage capacity and operating speeds of memory devices continue to increase, the power consumed by such devices has continued to increase in a corresponding manner. Therefore, many attempts to reduce the power consumed by an electronic device have focused on reducing the power consumption of memory devices.

In general, the power consumed by a memory device increases with both the capacity and the operating speed of the memory device. The power consumed by memory devices is also affected by their operating mode. For example, a DRAM device generally consumes a relatively large amount of power when the memory cells of the DRAM device are being refreshed. As is well-known in the art, DRAM memory cells, each of which essentially consists of a capacitor, must be periodically refreshed to retain data stored in the DRAM device. Refresh is typically performed by essentially reading data bits from the memory cells in each row of a memory cell array and then writing those same data bits back to the same cells in the row. A relatively large amount of power is consumed when refreshing a DRAM because rows of memory cells in a memory cell array are being actuated in the rapid sequence. Each time a row of memory cells is actuated, a pair of digit lines for each memory cell are switched to complementary voltages and then equilibrated. As a result, DRAM refreshes tend to be particularly power-hungry operations. Further, since refreshing memory cells must be accomplished even when the DRAM is not being used and is thus inactive, the amount of power consumed by refresh is a critical determinant of the amount of power consumed by the DRAM over an extended period. Thus many attempts to reduce power consumption in DRAM devices have focused on reducing the rate at which power is consumed during refresh.

Refresh power can, of course, be reduced by reducing the rate at which the memory cells in a DRAM are being refreshed. However, reducing the refresh rate increases the risk that data stored in the DRAM memory cells will be lost. More specifically, since, as mentioned above, DRAM memory cells are essentially capacitors, charge inherently leaks from the memory cell capacitors, which can change the value of a data bit stored in the memory cell over time. However, current leaks from capacitors at varying rates. Some capacitors are essentially short-circuited and are thus incapable of storing charge indicative of a data bit. These defective memory cells can be detected during production testing, and can then be repaired by substituting non-defective memory cells using conventional redundancy circuitry. On the other hand, current leaks from most DRAM memory cells at much slower rates that span a wide range. A DRAM refresh rate is chosen to ensure that all but a few memory cells can store data bits without data loss. This refresh rate is typically once every 64 ms. The memory cells that cannot reliably retain data bits at this refresh rate are detected during production testing and replaced by redundant memory cells.

One technique that has been used to prevent data errors during refresh as well as at other times is to generate an error correcting code "ECC," which is known as a "syndrome," from each item of stored data, and then store the syndrome along with the data. When the data are read from the memory device, the syndrome is also read, and it is then used to determine if any bits of the data are in error. As long as not too many data bits are in error, the syndrome may also be used to correct the read data.

The use of ECC techniques can allow DRAM devices to be refreshed at a slower refresh rate since resulting data bit errors can be corrected as long as the refresh rate is not so low that more errors are generated than can be corrected by ECC techniques. The use of a slower refresh rate can provide the significant advantage of reducing the power consumed by DRAM devices. Prior to entering a reduced power refresh mode, each item of data is read. A syndrome corresponding to the read data is then generated and stored in the DRAM device. When exiting the reduced power refresh mode, the each item of data and each corresponding syndrome are read from the DRAM device. The read syndrome is then used to determine if the item of read data is in error. If the item of read data is found to be in error, the read syndrome is used to correct the read item of data, and the incorrect item of data is then overwritten with the corrected item of data.

One disadvantage of using the above-described ECC techniques in memory systems is the time and power required to generate and store ECC syndromes when entering the reduced power refresh mode. Each time the reduced power refresh mode is entered, all of the data stored in the DRAM device must be read, and a syndrome must be generated for each item or group of items of read data. The generated syndromes must then be stored. It can require a substantial period of time to accomplish these operations for the large amount of data stored in conventional high-capacity DRAM devices. During this time that the stored data are being checked, the DRAM device generally cannot be accessed for a read or a write operation. As a result, the operation of memory access devices, such as processors, is stalled until the data checking operations have been completed. Furthermore, a substantial amount of power can be consumed during the time the stored data are being checked and possibly corrected. These operations must be performed even though very little if any of the data stored in the DRAM device may have changed since the data was previously read and corresponding syndromes stored.

A similar problem exists where ECC techniques are being used to correct data storage errors in normal operation, i.e., not for a reduced power refresh mode. Each time a read request is coupled to a DRAM or other memory device, the syndrome corresponding to the read data must also be read, and the read data must then be checked using the read syndrome. These operations must be performed each time a read request is received even though the read data may not have changed since the read data was either written or previously read. The time required to perform these operations increases the latency of the memory device since the read data are not accessible to a memory requester until after these operations have been completed.

There is therefore a need for a memory system and method that uses ECC techniques to insure data integrity and allow operations in a reduced power refresh mode, but does so in a manner that does not unduly increase the read latency or power consumption of the memory device.

SUMMARY OF THE INVENTION

An error checking and correction ("ECC") method and system includes an ECC syndrome and a respective flag bit stored for each of a plurality of groups of data bits stored in an array of memory cells. The flag bit has a first value when the ECC syndrome is stored, and a second value if any of the data bits in the respective group are modified such as by writing data to the memory cells storing the data bits. The ECC method and system may be used in a reduced power refresh mode by checking the flag bit corresponding to each group of data bits and then generating and storing a new syndrome if the flag bit has the second value indicative of at least some of the data bits in a group were modified since the previous refresh. The ECC method and system may also be used during refresh or in normal operation to determine if an ECC syndrome can be used to check and correct corresponding data. When used in this manner, the ECC syndrome is used to check the correctness of the data bits, and, if an error is found, to generate corrected data bits. The corrected data bits can then be stored in the memory device.

DETAILED DESCRIPTION

Figure 1:
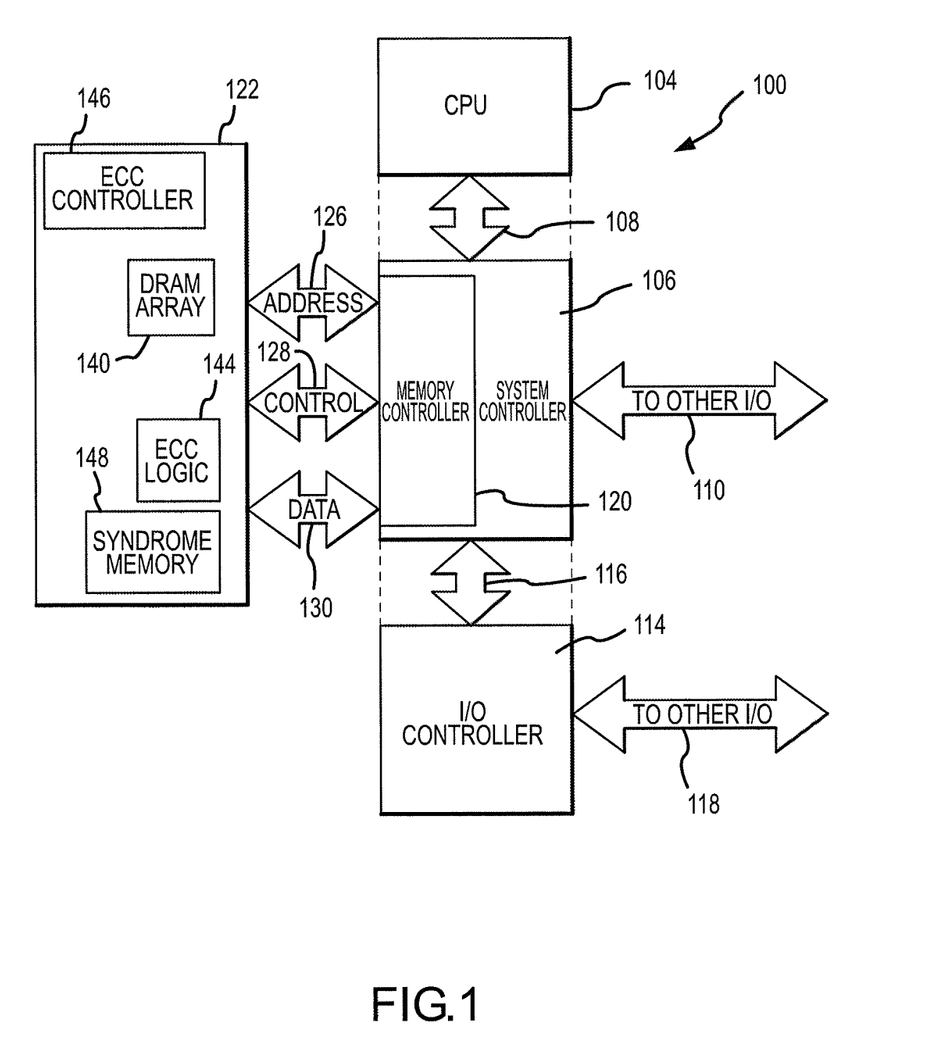
FIG. 1 is a block diagram of a computer system according to one of the invention.

A computer system 100 including a memory device employing ECC techniques according to one embodiment of the invention is shown in FIG. 1. The computer system 100 includes a central processor unit ("CPU") 104 coupled to a system controller 106 through a processor bus 108. The system controller 106 is coupled to input/output ("I/O") devices (not shown) through a peripheral bus 110 and to an I/O controller 114 through an expansion bus 116. The I/O controller 114 is also connected to various peripheral devices (not shown) through an I/O bus 118. The system controller 106 includes a memory controller 120 that is coupled to a dynamic random access memory ("DRAM") 122 through an address bus 126, a control bus 128, and a data bus 130. The DRAM 122 includes a DRAM array 140 that stores data. The locations in the DRAM 122 to which data are written and data are read are designated by addresses coupled to the DRAM 122 on the address bus 126. The operation of the DRAM 122 is controlled by control signals coupled to the DRAM 122 on the control bus 128. These control signals can cause the DRAM 122 to operate in various refresh modes, such as a "self-refresh" mode in which periodic refresh cycles are periodically initiated without the need to apply control signals to the DRAM 122. The DRAM 122 also includes ECC logic 144 that is operable to generate syndromes corresponding to data stored in the DRAM array 140, and to check and, if necessary, correct data. The operation of the ECC logic 144 is controlled by an ECC controller 146. The syndromes generated by the ECC logic 144 are stored in a syndrome memory 148.

Figure 2:
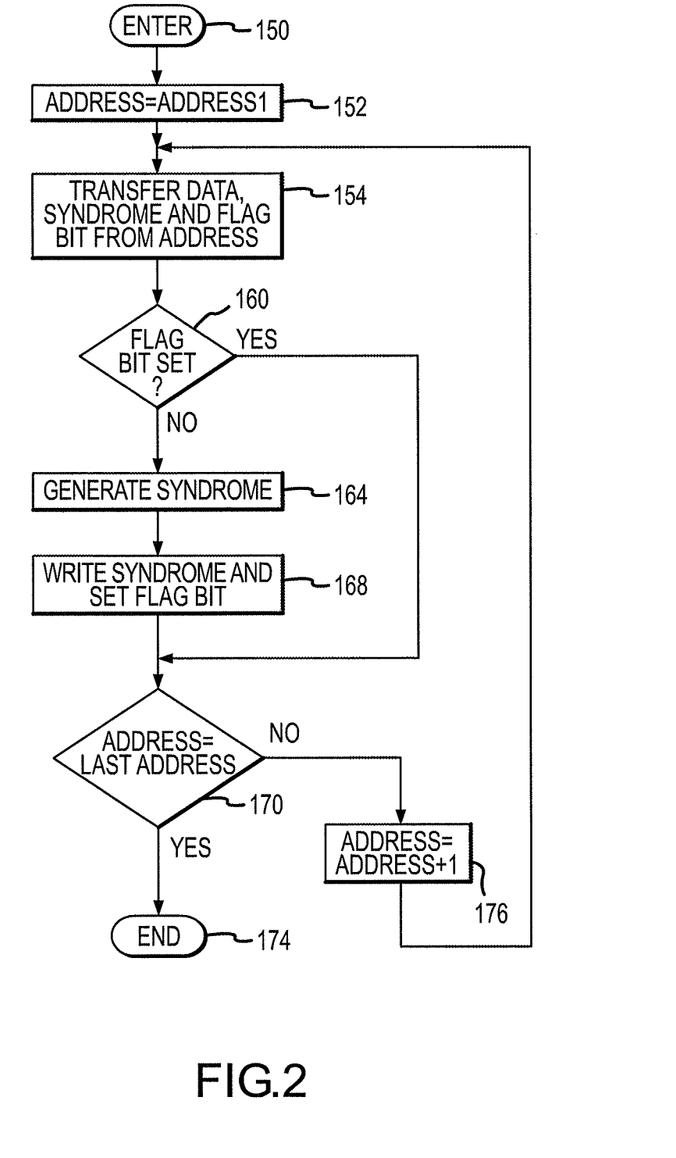
FIG. 2 is a flow chart showing the operation of the memory device of FIG. 1 in a low power refresh mode.

According to one embodiment of the invention, the DRAM 122 enters a reduced power mode refresh mode, such as a self-refresh mode, at step 150 using the process shown in FIG. 2. In step 152, the ECC controller 146 initializes an address to a first address in the DRAM array 140. This address is preferably the address for the first row of memory cells in the DRAM array 140 since the refresh of the DRAM array 140 is performed on a row-by-row basis. In step 154, the ECC controller 146 causes data stored in the DRAM array 140 at a current address (which is initially the first address) and a corresponding syndrome and flag bit to be transferred from the DRAM array 140 and the syndrome memory 148, respectively, to the ECC logic 144. In transferring the data from the DRAM array 140, the memory cells storing the data are inherently refreshed.

The ECC logic 144 initially does not use the syndrome to check the read data. Instead, the ECC logic 144 checks to see if a flag bit appended to the syndrome has been set at step 160. The flag bit is an extra bit appended to the syndrome that indicates whether the stored data corresponding to the syndrome has been modified since the ECC syndrome was generated. The first time the DRAM 122 enters the reduced power refresh mode, a syndrome will not have been generated for the data, and the flag bit will not have been set. Therefore, the process branches to step 164 where the ECC logic 144 generates a syndrome corresponding to the data. The ECC controller 146 then causes the syndrome and set flag bit to be written to the syndrome memory 148 at step 168. A check is then made at step 170 to determine if the data transferred to the ECC logic 144 was stored in the DRAM array 140 at the last address in the DRAM array 140. If it is, the process ends at step 174 until the low power refresh is again initiated at step 150. If the data is not from the last address in the DRAM array 140, the address is incremented at step 176, and the process returns to step 154.

When the DRAM 122 subsequently enters the reduced power refresh mode, the process shown in FIG. 2 again starts at 150. The ECC controller 146 again initializes an address to a first address in the DRAM array 140 and then causes data stored in the DRAM array 140 and a corresponding syndrome and flag bit to be transferred to the ECC logic 144. In transferring the data from the DRAM array 140, the memory cells storing the data are again refreshed. The ECC logic 144 again checks to see if a flag bit appended to the syndrome has been set at step 160. If the DRAM array 140 was previously refreshed in the reduced power mode and if no data have been written to the memory cells corresponding to the current address since the last refresh, the flag bit will still be set. The process shown in FIG. 2 then branches directly to step 170, thus bypassing step 164 where a syndrome is generated and step 168 where the syndrome and set flag bit are written to the syndrome memory 148. The process then loops through steps 154-176 until the entire DRAM array 140 has been refreshed. The use of ECC techniques in the reduced power refresh mode allows refresh to occur at a rate that is sufficiently low that data retention errors can be expected since a limited number of data retention errors can be corrected As is well known in the art, ECC techniques allow a limited number of bits to be corrected. Therefore, the refresh rate in the reduced power refresh mode should not be so low that more errors are generated in a group of data than can be corrected by the ECC techniques. This reduced refresh rate can significantly reduce the power consumed by the DRAM 122.

It is possible for the data stored in the DRAM array 140 to be modified between refreshes by, for example, writing data to the DRAM array 140. For this reason, each time data are written to the DRAM array 140, the ECC logic 144 resets the flag bit appended to the syndrome corresponding to the data stored in the memory cells to which the data are written.

One of the advantages of using the process shown in FIG. 2 is that, in many cases, it will be necessary to generate and store syndromes for very few memory cells in the DRAM array 140. When the DRAM 122 is idle, as it generally will be when in a reduced power refresh mode, such as a self-refresh mode, data will not be written to the DRAM array 140. As a result, the flag bit appended to almost all syndromes will still be set, thus making it unnecessary to generate and store syndromes for almost all of the memory cells in the DRAM array 140. As a result, the power consumed by the DRAM 122 is reduced by the amount of power that would be consumed in performing these syndrome generating and storing operations. Without using the process shown in FIG. 2, it would be necessary to generate and store syndromes for all of the data stored in the DRAM array 140 each time the reduced power refresh mode was entered thereby consuming substantially more power.

The reduced power refresh mode of the DRAM 122 also may be conducted using alternate processes. For example, prior to entering a reduced power refresh mode, the ECC logic 144 can generate a syndrome from all of the data stored in the DRAM array 140, and each generated syndrome and a set flag bit can then be stored in the syndrome memory 148. As a result, the ECC logic 144 will not detect a flag bit that has not been set when performing the first refresh in the reduced refresh mode.

Figure 3:
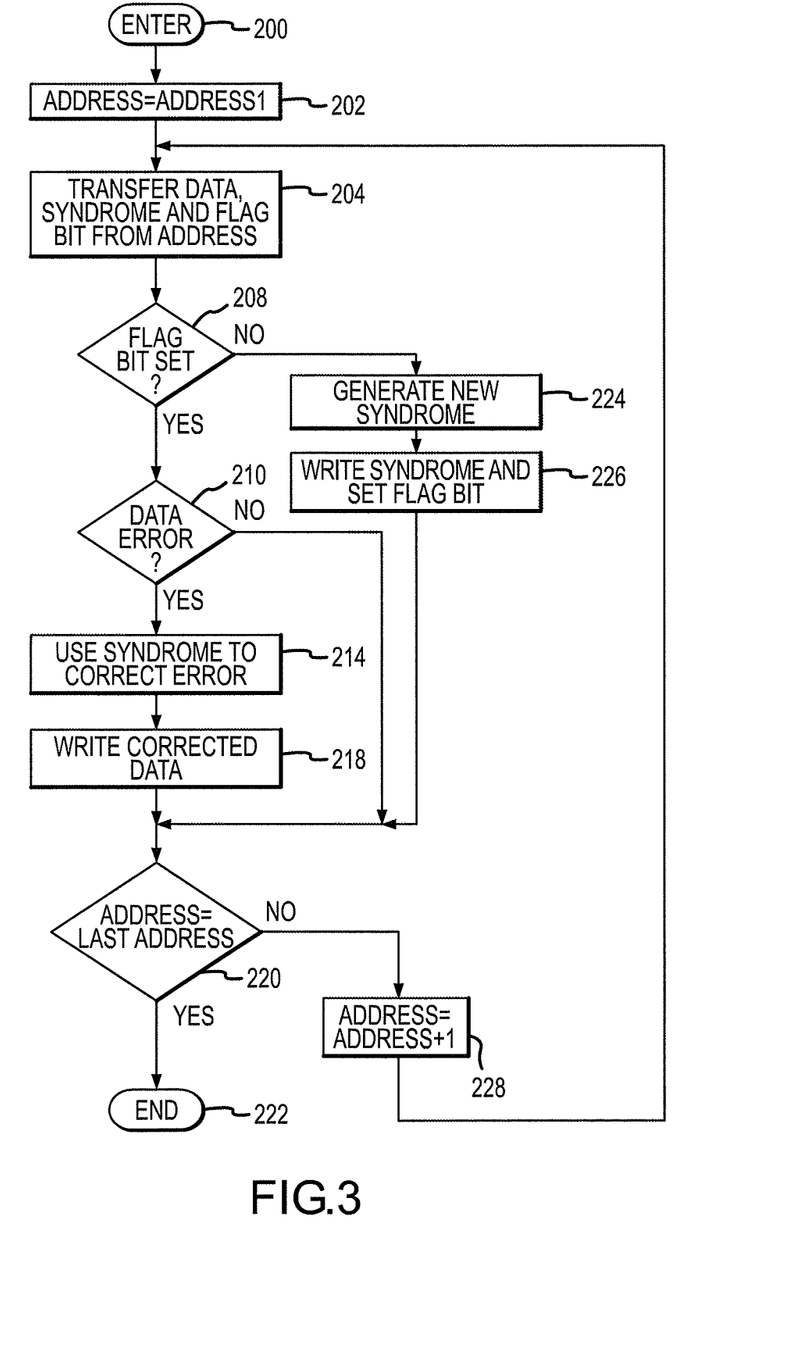
FIG. 3 is a flow chart showing the operation of the memory device of FIG. 1 in checking the integrity of data stored in the memory device.

A process that is similar to the process shown in FIG. 2 can also be used to reduce power consumption when background ECC techniques are being used to insure the integrity of data stored in the DRAM 122. As with the process shown in FIG. 2, each time data are written the DRAM array 140, the flag bit of a corresponding syndrome is reset. The process, which is shown in FIG. 3, is entered at 200 when the integrity of a group of data, such as data stored in an entire row, is to be checked. The ECC controller 146 initializes an address to a first address in the DRAM array 140 at step 202. This address is preferably the address for the first row of memory cells in the DRAM array 140. In step 204, the ECC controller 146 causes data stored in the DRAM array 140 at the current address, a corresponding syndrome and a corresponding flag bit to be transferred from the DRAM array 140 and the syndrome memory 148, respectively, to the ECC logic 144. The ECC logic 144 checks to see if a flag bit appended to the syndrome is set at step 208. If the flag bit is set, meaning that the data has not been modified since the last integrity check, the ECC logic 144 uses the syndrome to determine if any data retention errors have arisen at step 210. If the syndrome indicates the data are in error, the syndrome is used to correct the error at step 214. The corrected data are then written to the DRAM array 140 at step 218 before progressing to step 220. If no data retention error was detected at step 210, the process branches directly to step 220.

If the ECC logic 144 determines at step 208 that the flag bit is not set, meaning that the data corresponding to the syndrome have been modified, the process branches to step 224 where the ECC logic 144 generates a new syndrome. This syndrome, as well as a set flag bit, are then written to the syndrome memory 148 at step 226 before branching to step 220.

At step 220, a check is made to determine if the data transferred to the ECC logic 144 for integrity checking was stored in the final address of the DRAM array. If so, the process ends at step 222 until the integrity check is again initiated at step 200. Otherwise, the address is incremented at step 228, and the process returns to step 204.

The use of the process shown in FIG. 3 can considerably reduce the power consumed by the DRAM 122 since it will often not be necessary to generate and store syndromes for the data stored in the DRAM array 140. Instead, it will be necessary to generate and store a syndrome for data only if the data have been modified. If there was no way of determining if the data had changed, it would be necessary to generate and store a syndrome each time data was written to the DRAM 122. Furthermore, if the syndrome did not match data stored in the DRAM array 140, there would be no way to determine if a data retention error had occurred (in which case the syndrome should be used to generate and store corrected data) or if new data had been written to that location (in which case the syndrome should not be used to generate and store corrected data).

Figure 4:
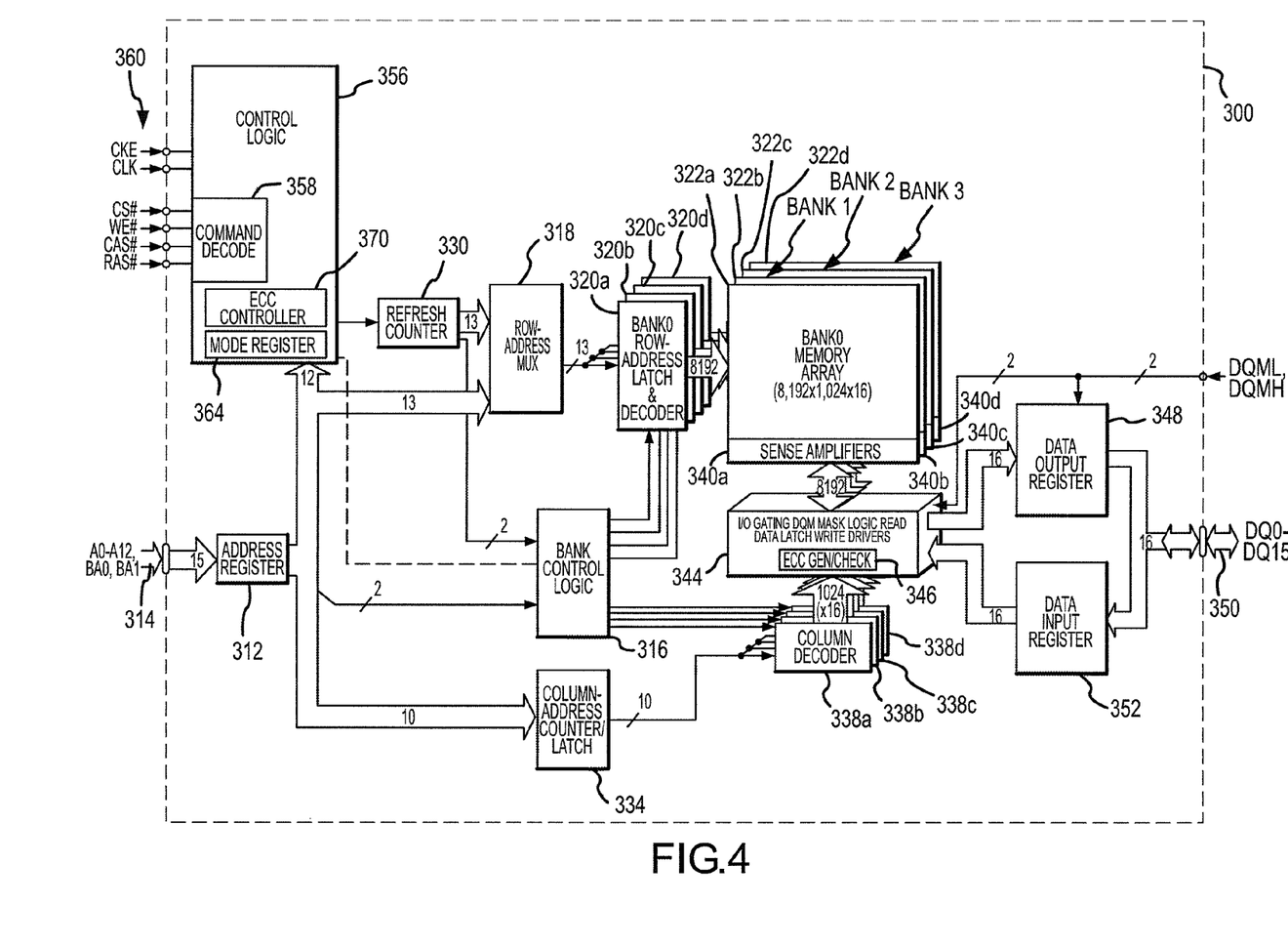
FIG. 4 is a block diagram of a memory device according to one embodiment of the invention that may be used in the computer system of FIG. 1.

A synchronous DRAM ("SDRAM") 300 according to one embodiment of the invention is shown in FIG. 4. The SDRAM 300 includes an address register 312 that receives bank addresses, row addresses and column addresses on an address bus 314. The address bus 314 is generally coupled to a memory controller like the memory controller 120 shown in FIG. 1. Typically, a bank address is received by the address register 312 and is coupled to bank control logic 316 that generates bank control signals, which are described further below. The bank address is normally coupled to the SDRAM 300 along with a row address. The row address is received by the address register 312 and applied to a row address multiplexer 318. The row address multiplexer 318 couples the row address to row address latch & decoder circuit 320a-d for each of several banks of memory cell arrays 322a-d, respectively.

One of the latch & decoder circuits 320a-d is enabled by a control signal from the bank control logic 316 depending on which bank of memory cell arrays 322a-d is selected by the bank address. The selected latch & decoder circuit 320 applies various signals to its respective bank 322 as a function of the row address stored in the latch & decoder circuit 320. These signals include word line voltages that activate respective rows of memory cells in the banks 322a-d.

The row address multiplexer 318 also couples row addresses to the row address latch & decoder circuits 320a-d for the purpose of refreshing the memory cells in the banks 322a-d. The row addresses are generated for refresh purposes by a refresh counter 330. The refresh counter 330 periodically increments to output row addresses for rows in the banks 322a-d. During operation in the low power, reduced refresh rate mode described above, the refresh counter 330 causes the memory cells in the banks 322a-d to be refreshed at a rate that is sufficiently low that data errors are likely to occur. Refreshing the memory cells at this low rate causes relatively little power to be consumed during self-refresh or other reduced refresh periods. During operation in a normal refresh mode, the refresh counter 330 periodically increments at a normal refresh rate that generally does not result in data retention errors during a normal refresh mode. The refresh of the memory cells is typically performed every 64 ms.

After the bank and row addresses have been applied to the address register 312, a column address is applied to the address register 312. The address register 312 couples the column address to a column address counter/latch circuit 334. The counter/latch circuit 334 stores the column address, and, when operating in a burst mode, generates column addresses that increment from the received column address. In either case, either the stored column address or incrementally increasing column addresses are coupled to column address & decoders 338a-d for the respective banks 322a-d. The column address & decoders 338a-d apply various signals to respective sense amplifiers 340a-d through column interface circuitry 344. The column interface circuitry 344 includes conventional I/O gating circuits, DQM mask logic, read data latches for storing read data from the memory cells in the banks 322a-d and write drivers for coupling write data to the memory cells in the banks 322a-d.

The column interface circuitry 344 also includes an ECC generator/checker 346 that essentially performs the same function as the ECC logic 144 in the DRAM 122 of FIG. 1. The ECC generator/checker 346 may be implemented by conventional means, such as by chains of exclusive OR gates implementing a Hamming code. Syndromes corresponding to the data stored in the memory cells in the banks 322a-d and corresponding flag bits may be stored in one or more of the banks 322a-d. Data from one of the banks 322a-d are sensed by the respective set of sense amplifiers 342a-d. When data are transferred from the memory cells of the banks 322a-d during the reduced power refresh mode, the corresponding syndrome and flag bit is coupled to the ECC generator checker 346. The ECC generator/checker 346 then checks and, if necessary, corrects the data as explained above. In the event data are being coupled from the banks 322a-d for a read operation, the data are coupled to a data output register 348, which applies the read data to a data bus 350. Data read from one of the banks 322a-d may be coupled to the data bus 350 through the data output register 348 without be processed by the ECC generator/checker 346. Alternatively, the read data may be processed by the ECC generator/checker 346 to detect and correct errors in the read data.

Data to be written to the memory cells in one or more of the banks 322a-d are coupled from the data bus 350 through a data input register 352 directly to write drivers in the column interface circuitry 344 without interfacing with the ECC generator/checker 346. However, the flag bit corresponding to the write data is reset as explained above to indicate that any data stored in the location where the data are written has been modified. Alternatively, write data may be coupled to the ECC generator/checker 346 so it can generate a corresponding syndrome. The write data, the corresponding syndrome and a set flag bit are then coupled to write drivers in the column interface circuitry 344, which couple the data, syndrome and flag bit to the memory cells in one of the banks 322a-d. A pair of complementary data mask signals "DQML" and "DQMH" may be applied to the column interface circuitry 344 and the data output register 348 to selectively alter the flow of data into and out of the column interface circuitry 344, such as by selectively masking data to be read from the banks of memory cell arrays 322a-d.

The above-described operation of the SDRAM 300 is controlled by control logic 356, which includes a command decoder 358 that receives command signals through a command bus 360. These high level command signals, which are typically generated by a memory controller such as the memory controller 120 of FIG. 1, are a clock chip select signal CS#, a write enable signal WE#, a column address strobe signal CAS#, and a row address strobe signal RAS#, with the "#" designating the signal as active low. Various combinations of these signals are registered as respective commands, such as a read command or a write command. The control logic 356 also receives a clock signal CLK and a clock enable signal CKE, which allow the SDRAM 300 to operate in a synchronous manner. The control logic 356 generates a sequence of control signals responsive to the command signals to carry out the function (e.g., a read or a write) designated by each of the command signals. The control logic 356 also applies signals to the refresh counter 330 to control the operation of the refresh counter 230 during refresh of the memory cells in the banks 322. The control signals generated by the control logic 356, and the manner in which they accomplish their respective functions, are conventional. Therefore, in the interest of brevity, a further explanation of these control signals will be omitted.

The control logic 356 also includes a mode register 364 that may be programmed by signals coupled through the command bus 360 during initialization of the SDRAM 300. The mode register 364 then generates a mode bit that is used by the control logic 356 to enable the reduced power ECC modes described above with respect to FIGS. 2 and 3. Finally, the control logic 356 also includes an ECC controller 370 that essentially performs the functions of the ECC controller 146 in the DRAM 122 of FIG. 1. The ECC controller 146 causes the control logic 356 to issue control signals to the ECC generator/checker 346 and other components to generate syndromes and flag bits for storage in the banks 322a-d, and to check and correct data read from the banks 322a-d using the stored syndromes and flag bits.

Figure 5:
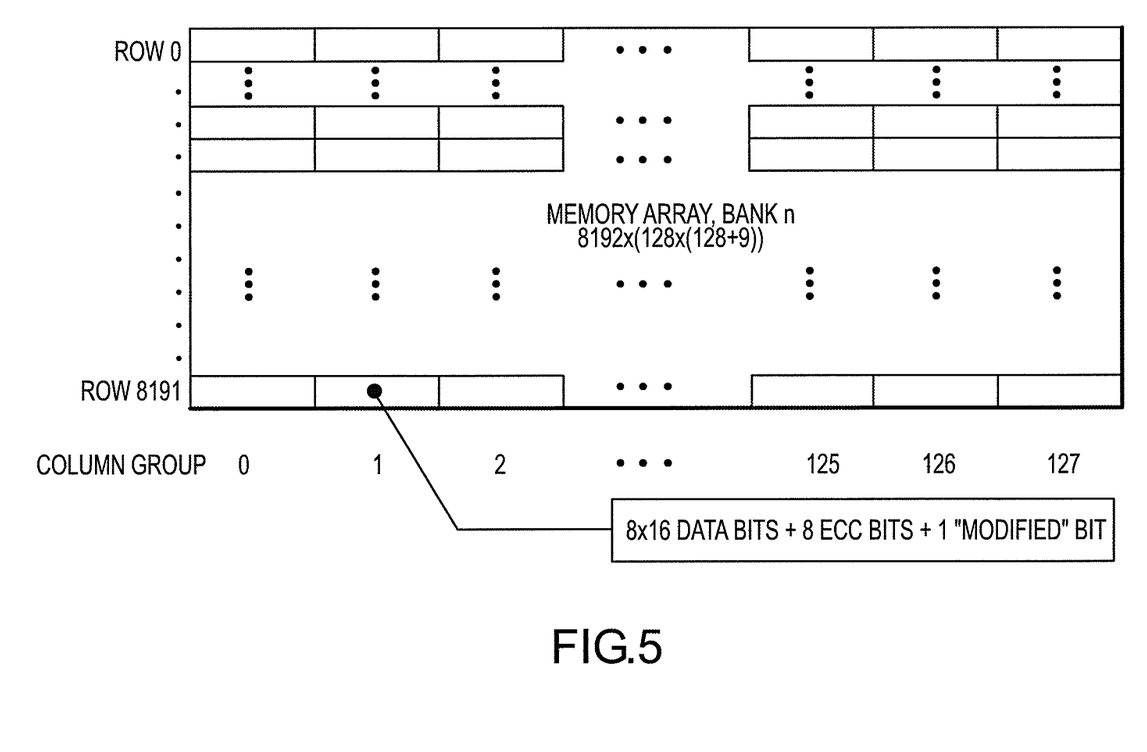
FIG. 5 is an address map showing the organization of data stored in the memory device of FIG. 1 or FIG. 4 according to one embodiment of the invention.

Although the SDRAM device 300 can have a variety of configurations, in one embodiment the storage of data in the SDRAM device 300 is organized as shown in FIG. 5. As shown in FIG. 5, each row of memory cells in the DRAM array 140 contains 128 column groups, and each column group contains 128 bits of data arranged as 8 16-bit words plus an additional 9 bits that are used to store an 8-bit ECC syndrome and 1 flag bit. The 8 syndrome bits are capable of correcting a single bit error in the respective column group. If the ability to correct a larger number of bits is desired, then the number of syndrome bits can be increases accordingly.

Figure 6:
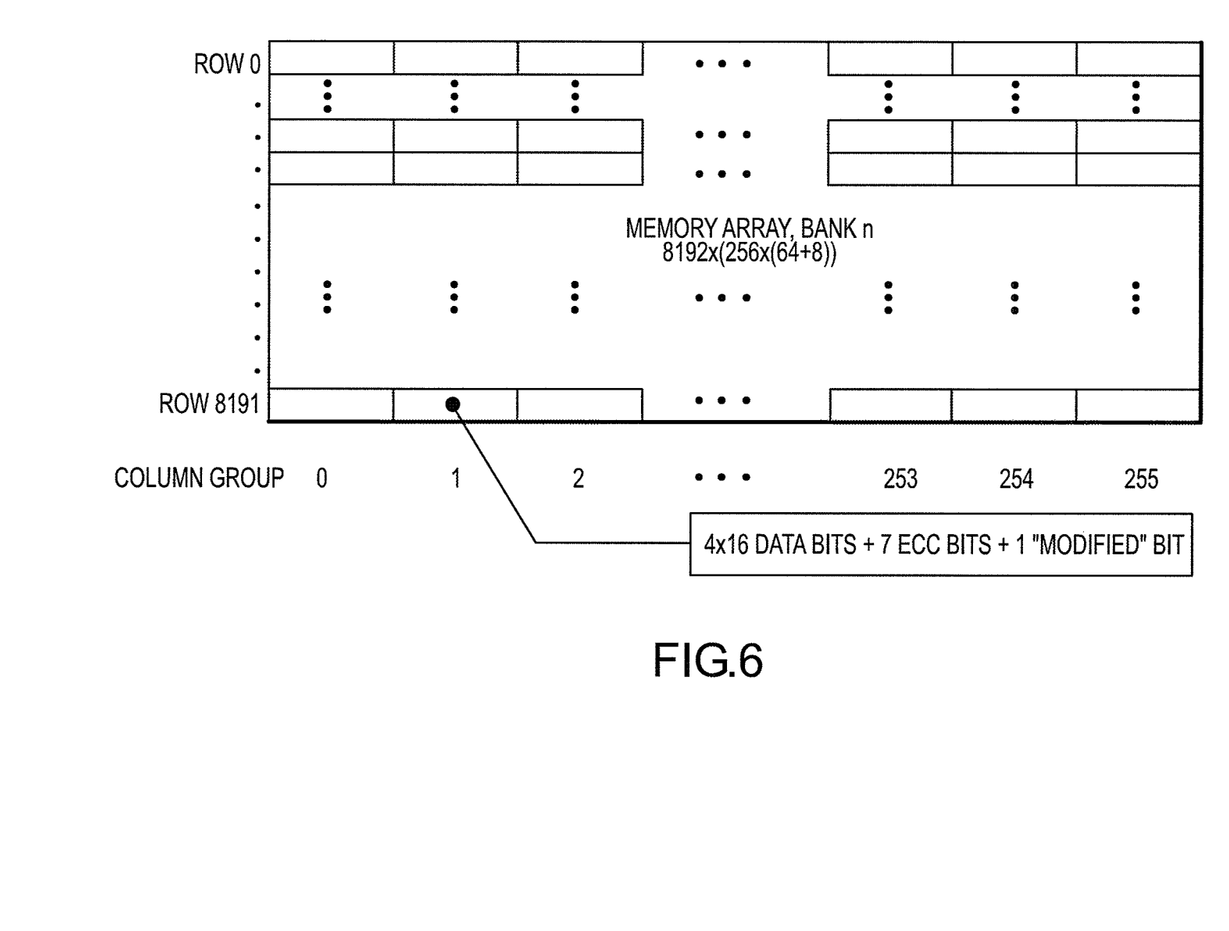
FIG. 6 is an address map showing the organization of data stored in the memory device of FIG. 1 or FIG. 4 according to another embodiment of the invention.

One disadvantage of the arrangement for storing data as shown in FIG. 5 is that each column group contains an odd number of bits, i.e., 128 data bits, 8 syndrome bits and 1 flag bit. However, memory devices generally use rows with an even number of columns. To alleviate this disadvantage, data can be stored in the SDRAM device 300 using organization shown in FIG. 6. As shown in FIG. 6, each row of memory cells in the DRAM array 140 contains 256 column groups, and each column group contains 64 bits of data arranged as 4 16-bit words plus an additional 8 bits that are used to store a 7-bit ECC syndrome and 1 flag bit. The 7 syndrome bits are capable of correcting a single bit error in the 64 bits in the respective column group. As a result, each column group now contains an even number of bits, i.e., 64 data bits, 7 syndrome bits and 1 flag bit.

Although the present invention has been described with reference to the disclosed embodiments, persons skilled in the art will recognize that changes may be made in form and detail without departing from the spirit and scope of the invention. For example, although the reduced power refresh mode has been described in the context of a self-refresh reduced power mode, it will be understood that it may also be used in other refresh modes. Other variations will also be apparent to one skilled in the art. Accordingly, the invention is not limited except as by the appended claims.

We claim:

1. An apparatus, comprising:
    an ECC logic configured to generate an ECC syndrome associated with stored data;
    an ECC control circuit configured to store the ECC syndrome and a flag bit associated with the stored data, the flag bit having a first value when the ECC syndrome is stored and having a second value when any portion of the stored data is modified,
    wherein the ECC logic is further configured to use the flag bit to determine if the stored data has been modified, and to generate a new ECC syndrome for the stored data responsive, at least in part, to determining the stored data has been modified.

2. The apparatus of claim 1, wherein the ECC logic is further configured to use the syndrome to determine whether the stored data includes an error.

3. The apparatus of claim 2, wherein the ECC logic is further configured to correct the error responsive, at least in part, to determining the stored data includes the error.

4. The apparatus of claim 1, wherein the flag bit is appended to the syndrome.

5. The apparatus of claim 1, wherein the ECC logic is configured to generate an ECC syndrome during a low power refresh mode.

6. The apparatus of claim 1, wherein the stored data and the syndrome, the flag bit, or a combination thereof, are stored in a same array.

7. The apparatus of claim 1, wherein the apparatus is included in a memory.

8. A method, comprising:
    storing an ECC syndrome and a flag bit for a plurality of data bits, the flag bit indicative of whether any of the plurality of data bits have been modified;
    using the flag bit to determine if any of the plurality of data bits have been modified; and
    if the flag bit indicates any of the plurality of data bits have been modified, generating a new ECC syndrome for the plurality of data bits; and
    if the flag bit indicates none of the plurality of data bits have been modified, using the ECC syndrome to check the correctness of retrieved data bits.

9. The method of claim 8, wherein storing an ECC syndrome and a flag bit for a plurality of data bits comprises:
    storing the ECC syndrome; and
    appending the flag bit to the ECC syndrome.

10. The method of claim 8, further comprising:
    if the retrieved data bits comprise an error, using the ECC syndrome to correct the error.

11. The method of claim 8, wherein storing an ECC syndrome and a flag bit for a plurality of data bits comprises:
    storing the ECC syndrome and the flag bit in an array including the plurality of data bits.

12. The method of claim 8, further comprising:
    entering a low power refresh mode before using the flag bit to determine if any of the plurality of data bits have been modified.

13. The method of claim 12, wherein the ECC syndrome is generated before entering the low power refresh mode.

14. The method of claim 8, wherein at least one of the ECC syndrome and the flag bit comprises an odd number of bits.

15. A method, comprising:
    determining, with a flag bit, if any stored data has been modified; and
    if the flag bit indicates the stored data has been modified, generating an ECC syndrome for the stored data; and
    if the flag bit indicates the stored data has not been modified:
    determining whether the stored data is in error using the ECC syndrome; and
    if the stored data is in error, correcting the stored data using the ECC syndrome.

16. The method of claim 15, further comprising:
    before generating an ECC syndrome, entering a self-refresh mode.

17. The method of claim 15, wherein the stored data is stored in a row of memory, the method further comprising:
    storing the ECC syndrome, the flag bit, or a combination thereof in the row of memory.

18. The method of claim 17, wherein the flag bit is appended to the ECC syndrome.

19. The method of claim 15, wherein the ECC syndrome comprises a Hamming code syndrome.

20. The method of claim 15, wherein correcting the stored data using the ECC syndrome comprises correcting a single bit error.

21. The method of claim 15, wherein determining, with a flag bit, if any stored data has been modified comprises determining, with a flag bit, if any stored data has been modified after a refresh of the stored data.

* * * * *

UNITED STATES PATENT AND TRADEMARK OFFICE
CERTIFICATE OF CORRECTION

PATENT NO. : 8,601,341 B2
APPLICATION NO. : 13/855534
DATED : December 3, 2013
INVENTOR(S) : J. Thomas Pawlowski et al.

It is certified that error appears in the above-identified patent and that said Letters Patent is hereby corrected as shown below:

On the title page, item (73), under "Assignee", in column 1, line 1, delete "Technologies," and insert -- Technology, --, therefor.

Signed and Sealed this
Twenty-fifth Day of March, 2014

Michelle K. Lee
*Deputy Director of the United States Patent and Trademark Office*